(12) United States Patent
Muntz et al.

(10) Patent No.: US 6,264,090 B1
(45) Date of Patent: Jul. 24, 2001

(54) HIGH SPEED JET SOLDERING SYSTEM

(75) Inventors: Eric Phillip Muntz, Pasadena; Melissa E. Orme-Marmarelis, Irvine; Gerald C. Pham-Van-Diep, Newport Beach, all of CA (US); Robert J. Balog, North Attleboro, MA (US)

(73) Assignee: Speedline Technologies, Inc., Franklin, MA (US)

( * ) Notice: Subject to any disclaimer, the term of this patent is extended or adjusted under 35 U.S.C. 154(b) by 0 days.

(21) Appl. No.: 09/246,229

(22) Filed: Feb. 8, 1999

Related U.S. Application Data

(60) Division of application No. 08/583,641, filed on Jan. 5, 1996, now Pat. No. 5,938,102, and a continuation-in-part of application No. 08/533,508, filed on Sep. 25, 1995, now abandoned.

(51) Int. Cl.[7] .............................. B23K 31/02; B23K 1/06; B23K 20/10

(52) U.S. Cl. .............................. 228/33; 228/260; 228/262

(58) Field of Search .................................... 228/262, 254, 228/256, 260, 33

(56) References Cited

U.S. PATENT DOCUMENTS

| | | |
|---|---|---|
| 3,222,776 | 12/1965 | Kawecki . |
| 3,570,721 | 3/1971 | Cushman . |
| 3,588,906 | 6/1971 | Brimer et al. . |

(List continued on next page.)

FOREIGN PATENT DOCUMENTS

| | | |
|---|---|---|
| 404289457A | * 10/1992 | (JP) . |
| WO97/25175 | * 7/1997 | (WO) . |
| WO98/36864 | * 8/1998 | (WO) . |

OTHER PUBLICATIONS

NN72012354 IBM Technical Disclosure Bulletin (Disclosure and Figure), Jan. 1, 1972.*
NN7608840 IBM Technical Disclosure Bulletin (Disclosure and Figure), Aug. 1, 1976.*
*Orme, "Precision Droplet Streamline Manufacturing", Proceedings of the International Conference on Advanced Synthesis of engineered Structural Materials, Aug. 31, Sep. 2, 1992, San Francisco, CA pp. 237–244.
*Orme, "Rapid Solidification Materials Synthesis With Nano–Liter Droplets", SAE Technical Paper Series, Aerotech '93, Costa Mesa, CA, Sep. 27–30, 1993, pp. 113–118.
*Orme, "A Novel Technique of Rapid Solidification Net–Form Materials Synthesis", Journal of Materials Engineering and Performance, vol. 2, No. 3, Jun. 1993, pp. 339–405.
*Wallace, "Automated Electronic Circuit Manufacturing using Ink–Jet Technology", Transactions of the ASME, vol. 111, p. 108–111, Jun. 1989.
*Hayes, et al., "Application of Ink Jet Technology to Microelectronic Packaging", ISHM '89 Proceedings, Maryland, pp. 627–634, 1989.
*Priest, et al., Liquid Metal Jetting Technology: Application Issues for Hybrid Technology, *The International Journal of Microcircuits and Electronic Packaging*, vol. 17, No. 3, Third Quarter, 1994, pp. 219–227.
*Priest, et al., "Liquid Metal–Jetting: Its Application to SMT", *Journal of SMT*, Oct. 93, pp. 4–10, 1993.

Primary Examiner—Tom Dunn
Assistant Examiner—Kiley Stoner
(74) Attorney, Agent, or Firm—Mintz, Levin, Cohn, Ferris, Glovsky and Popeo, P.C.

(57) ABSTRACT

Depositing a selected pattern of solder droplets onto a substrate on which one or more electronic components are to be mounted, the substrate being mounted on a substrate support and moved relative to a solder ejector along a scan axis, the droplets being deflected along a fan axis that is transverse to the scan axis by selectively applying a charge and passing the charged droplets through an electric field.

12 Claims, 3 Drawing Sheets

U.S. PATENT DOCUMENTS

| | | | |
|---|---|---|---|
| 3,810,194 * | 5/1974 | Tokunaga et al. | 346/75 |
| 3,826,224 | 7/1974 | Baker . | |
| 3,916,042 | 10/1975 | Grietens . | |
| 4,075,636 | 2/1978 | Galetto et al. . | |
| 4,126,711 | 11/1978 | Marlow . | |
| 4,303,108 | 12/1981 | Alcers . | |
| 4,347,521 | 8/1982 | Teumer . | |
| 4,530,464 | 7/1985 | Yamamoto et al. . | |
| 4,551,731 | 11/1985 | Lewis et al. . | |
| 4,575,730 | 3/1986 | Logan et al. . | |
| 4,597,420 | 7/1986 | Schoenthaler . | |
| 4,828,886 | 5/1989 | Hieber . | |
| 5,024,255 | 6/1991 | Watanabe . | |
| 5,193,738 | 3/1993 | Hayes . | |
| 5,229,016 * | 7/1993 | Hayes et al. | 222/590 |
| 5,320,250 | 6/1994 | La . | |
| 5,377,961 | 1/1995 | Smith . | |
| 5,397,902 | 3/1995 | Hayes . | |
| 5,498,444 * | 3/1996 | Hayes | 427/162 |
| 5,506,385 | 4/1996 | Murakami et al. . | |
| 5,507,327 | 4/1996 | Ziegler . | |
| 5,560,543 * | 10/1996 | Smith et al. | 239/102.2 |
| 5,707,684 * | 1/1998 | Hayes et al. | 427/162 |
| 5,810,988 * | 9/1998 | Smith, Jr. et al. | 204/666 |
| 5,820,932 * | 10/1998 | Hallman et al. | 427/261 |
| 5,868,305 * | 2/1999 | Watts, Jr. et al. | 228/254 |
| 5,894,980 * | 4/1999 | Orme-Marmarelis et al. | 228/33 |
| 5,894,985 * | 4/1999 | Orme-Marmarelis et al. | 228/262 |
| 5,938,102 * | 8/1999 | Muntz et al. | 228/102 |

* cited by examiner

HIGH SPEED JET SOLDERING SYSTEM

This application is a divisional application under 37 CFR §1.53(b) of U.S. Ser. No. 08/583,641 now U.S. Pat. No. 5,938,102, filed on Jan. 5, 1996, incorporated herein by reference.

This application is a continuation-in-part of U.S. Ser. No. 08/533,508, filed on Sep. 25, 1995 now abandoned, the disclosure of which is hereby incorporated by reference.

BACKGROUND OF THE INVENTION

This invention relates to a jet soldering system.

Various soldering schemes have been developed for bonding semiconductor integrated circuit (IC) chips to a substrate (e.g., a printed circuit board). In some schemes, a semiconductor IC chip is bonded to a substrate by applying a small solder bump to the bottom surface of the chip, aligning the solder bump with a bond pad on the surface of the substrate, and heating the solder bump until it reflows. In some other schemes, solder bumps are applied to bonding pads on a substrate; afterwards, electronic components are bonded to the substrate by positioning the components over the solder bumps and by heating and reflowing the solder bumps. Some schemes bond IC chips to a patterned layer of solder created by applying a thin layer of solder paste to a substrate through holes in a stencil, leaving a selected solder pattern on the substrate. Recently, solder jet systems have been proposed for depositing solder droplets onto a substrate in a selected pattern. Such systems include a solder droplet ejector, which may eject solder droplets on-demand or continuously. In one proposed continuous solder jet system, a droplet generator vibrates to form a stream of solder droplets; an electrical charge is applied to the droplets and the charged droplets are passed between charged deflection plates which selectively direct the droplets to a target surface or to a catcher system.

SUMMARY OF THE INVENTION

In one aspect, the invention features depositing a selected pattern of solder droplets onto a substrate on which one or more electronic components are to be mounted. There is relative movement between the substrate and a solder ejector along a scan axis. The droplets from the ejector are deflected along a fan axis that is transverse to the scan axis by selectively applying a charge to each droplet and passing the charged droplets through an electric field. The position on the substrate along the scan axis at which a droplet is placed is determined by the relative position of the substrate with respect to the ejector at the time at which a charge is applied, and the position of the droplet along the transverse fan axis is determined by the magnitude of the charge applied to the droplet. The substrate can be moved or the ejector can be moved to provide the relative movement along the scan axis.

In preferred embodiments, the substrate is continuously moved along the scan axis, which avoids delays that would otherwise be introduced by moving the substrate step-wise and reduces the time taken to deposit the pattern of solder droplets. In order to permit placing of droplets on a substrate axis (i.e., in a row, which might very well be parallel to a substrate edge and might otherwise be oriented parallel to the fan axis), the substrate axis is oriented at an acute operating angle with respect to the fan axis.

The components generating the electric field (e.g., plates) can be rotatable about an axis which is normal to the substrate in order to orient the substrate with respect to the fan axis by rotating the fan axis with respect to the scan axis. Alternatively, the substrate can be mounted at an angle with respect to the scan axis on its movable support in order to adjust the angle between the substrate axis and the fan axis.

Preferably the pattern of solder droplets is defined by coordinate pattern data (e.g., CAD data) referenced with respect to the substrate, and these data are transformed to coordinate pattern data referenced with respect to a substrate support. The coordinate pattern data, which are generally referenced with respect to perpendicular axes, are also transformed to angle-adjusted coordinate pattern data according to the acute operating angle.

The acute operating angle is desirably determined by transforming the coordinate pattern data to angle-adjusted coordinate pattern data for a plurality of potential acute operating angle values, determining positions of droplets and spacings between droplets along the scan axis for angle-adjusted coordinate pattern data for each of the potential acute operating angle values, and selecting the acute operating angle from the plurality of potential acute operating angle values based upon the spacings between droplets. By selecting the operating angle that has the largest value for the smallest spacing between two droplets, the permitted velocity along the scan axis can be maximized to minimize processing time. In addition, the spacings along the scan axis can be increased (with a corresponding increase in velocity) by adjusting the scan axis position values for the angle-adjusted data to accommodate an allowable error for placement of each droplet; the allowable error is determined by the difference between the user-specified maximum error for placing droplets and the significantly smaller maximum error of the printing equipment.

After selecting an acute operating angle, the angle-adjusted coordinate pattern data are used to control when charges are applied to the solder droplets being ejected and to control the magnitude of the charges.

In another aspect the invention features depositing a selected pattern of solder droplets onto a substrate by directing molten solder droplets from a solder ejector through an electrical field, selectively applying charges to the solder droplets prior to passage through the field in order to control deflection of the solder droplets to a desired position along a fan axis, and creating relative movement between the substrate and the fan axis. In some embodiments the fan axis is moved (e.g., by rotating plates providing the field with the ejector either fixed or rotatable) and in some others the substrate is moved (e.g., rotated). Preferably the relative motion is continuous.

Other features and advantages of the invention will become apparent from the following description of preferred embodiments and from the claims.

DESCRIPTION OF THE PREFERRED EMBODIMENTS

Figure 1:
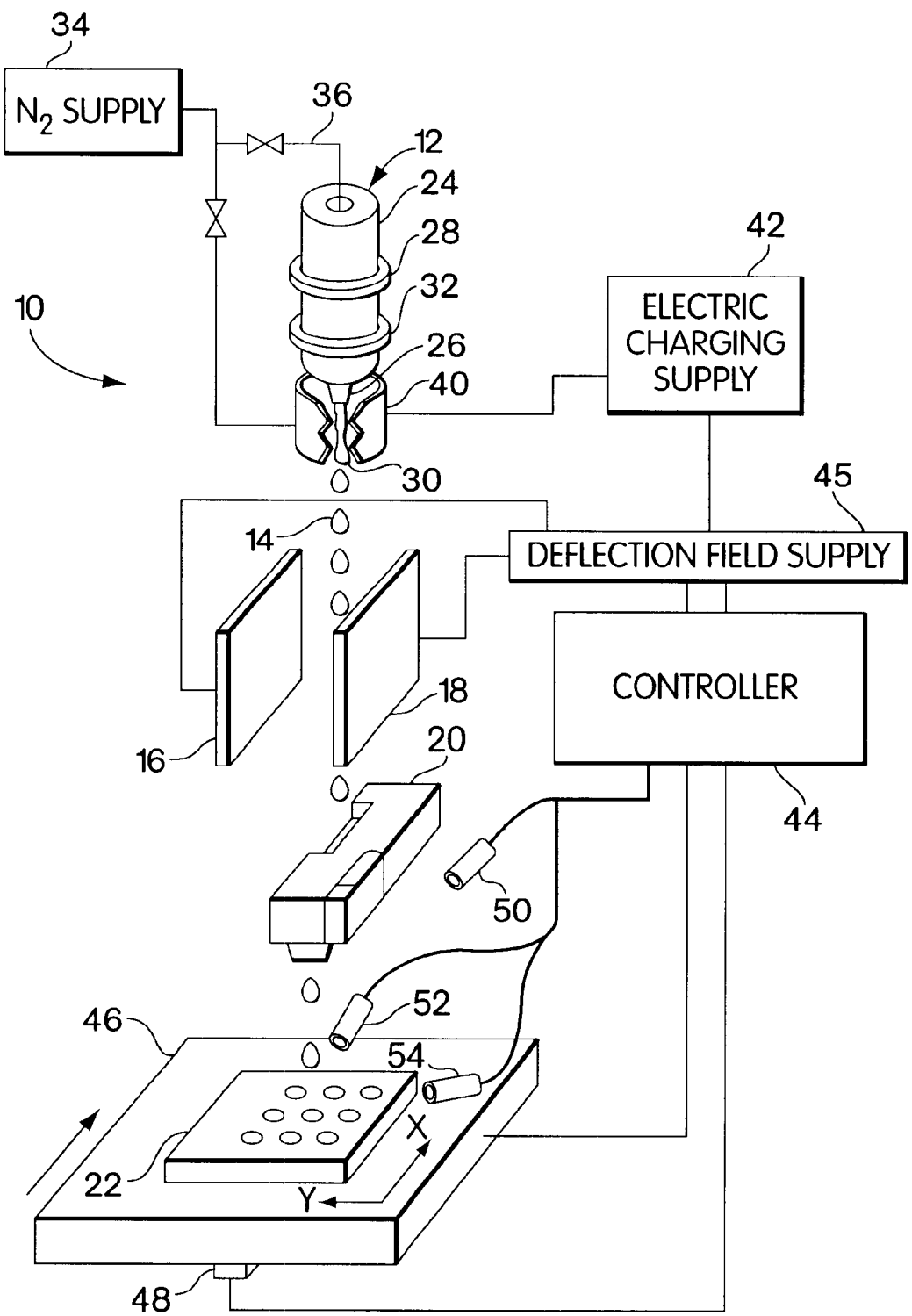
FIG. 1 is a diagrammatic perspective view of a jet soldering system for depositing solder droplets onto a substrate.

Referring to FIG. 1, jet soldering system 10 includes a solder ejector 12 for providing a continuous stream of charged solder droplets 14 and deflection plates 16, 18 for passing the charged solder droplets through to a gutter 20 or deflecting the droplets toward a substrate 22, on which one or more semiconductor IC chips are to be mounted. Solder ejector 12 is shown diagrammatically in FIG. 1; an example of an ejector that can be used is described in U.S. Ser. No. 08/533,508, filed Sep. 25, 1995. Solder ejector 12 includes a replaceable solder cartridge 24 having an orifice defining structure 26 at its bottom and an electromechanical vibrator 28 (a piezoelectric crystal vibrator) to vibrate the orifice defining structure 26, producing a standing wave in the stream of solder 30 leaving the ejector that controls droplet formation. Heaters 32 melt solder contained within the replaceable solder cartridge. A supply 34 delivers nitrogen gas (or other inert gas such as argon) along a gas line 36 to pressurize the cartridge to control the formation of solder droplets leaving the ejector. Nitrogen (or other inert gas such as argon) is also supplied via line 38 to a laminar flow producing structure 40 (shown partially broken away in FIG. 1) to provide a laminar flow of inert gas around droplets 14. The inert gas is high purity gas such as research grade or better. A droplet charging supply 42 is electrically connected to a conductive ring (not shown) around stream 30 so that a charge is selectively applied to the solder droplets 14 on a droplet-by-droplet basis at the instant that they break from stream 30.

Solder droplets 14, formed by ejector 12, are directed to pass between deflection plates 16, 18. Controller 44 controls the bias applied to deflection plates 16, 18 by deflection power supply 45. Controller 44 is coupled to linear x-y translation table 46, on which substrate 22 is mounted. A position indicator 48 provides signals to the controller for precisely coordinating the position of translation table along the X axis. Camera 50 (including a vision system to identify objects) images substrate 22 on x-y table 46 and solder droplets 14 deposited on substrate 22 so that controller 44 can coordinate the position of substrate 22 on the x-y table and calibrate the extent of droplet deflection caused by charging supply 42 and plates 16, 18. During a deposition run, table 46 is moved along the X axis, and the charge on each droplet 14 controls whether the solder droplet 14 is passed undeflected to gutter 20 or is deflected toward substrate 22 along a "fan axis" that is perpendicular to plates 16, 18 and transverse to the X axis. The magnitude of the charge determines the extent of deflection along the fan axis. In this way, the droplets can be directed in two axes to any desired location on the substrate surface. For substrates having a width that is greater than the deflection along the fan axis, different areas could be covered in multiple scans along the X axis, with the table being translated to a different position along the Y axis between scans.

Vibrator 28 is biased with a periodic waveform with a magnitude of about 50–300 V and a fundamental frequency (f) of about 12,000 Hz, which corresponds to:

$$f=(k \times V)/2\pi r_o$$

where:

k is a constant that varies between 0.4 and 0.8,

V is droplet velocity, and $r_o$ is orifice radius.

E.g., a 100 micron diameter orifice will require a frequency f of about 12,000 Hz, where V is approximately 5 meters/second. Of course, 12,000 Hz is merely an example, and other frequencies can be used.

In operation, controller 44 causes table 46 to move along the X axis and deflection field supply 45 to charge deflection plates 16, 18 (FIG. 1) to deflect charged droplets 14 passing therebetween so that charged droplets are selectively deflected along the fan axis to the desired position on the substrate or passed through to the collection gutter, based on the position of the substrate and the desired pattern of deposited solder droplets. After droplets have been deposited onto the substrate in a selected pattern, the substrate is removed from the x-y translation table.

To permit printing of a board in a minimum time, it is desirable to continuously move the table, and the board on it, in the scan direction, i.e., along the X axis. This, however, prevents one from depositing droplets at a plurality of locations that have the same X axis coordinate but different fan axis coordinates. E.g., if the fan axis were perpendicular to the X axis, i.e., the Y axis, and the pattern of solder locations included a row having the same X axis coordinate but different Y axis coordinates, only one droplet 14 could be deposited, because table 46, and substrate 22 on it, move in the time between droplets, namely 1/(12,000 Hz) or 0.00083 second, assuming a frequency of 12,000 Hz.

Figure 2:
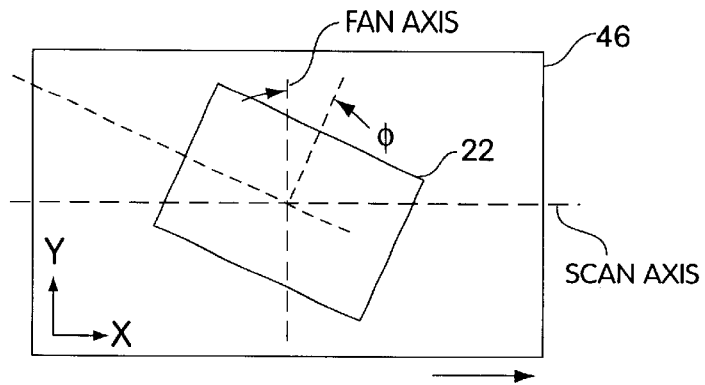
FIG. 2 is a diagrammatic plan view of a substrate oriented at an offset angle relative to the motion of a substrate translation table.
Figure 3:
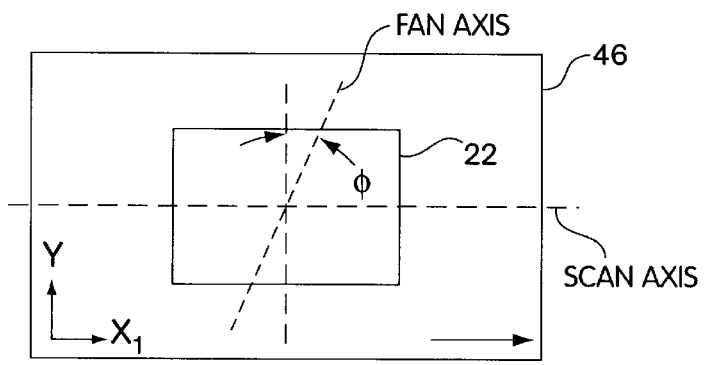
FIG. 3 is a diagrammatic view showing a fan axis for deflecting solder droplets in the FIG. 1 system oriented at an offset angle relative to the motion of the translation table.

In order to deposit droplets 14 on substrate 22 at locations along such axes, the relative orientation of substrate 22 and the droplet fan axis are adjusted. FIG. 2 illustrates keeping the fan axis on the Y axis and rotating substrate 22 by an off-set angle (φ) relative to the direction of table translation along the scan axis, i.e., the X axis, to make the adjustment to orientation. In FIG. 3, substrate 22 is aligned with the direction of table translation, and deflection plates 16, 18 are rotated at a fixed angle (φ) away from the Y axis (90° relative to the direction of table motion) to achieve the same result. The angle φ can typically be adjusted with an accuracy of ±0.01°. It is in general preferable to rotate the fan axis so that the direction of traverse (along the scan axis) can be selected independent of the traverse speed.

The angle φ is selected for a given pattern of solder pads on a substrate 22 so that, at any given position of table 46 in its travel along the X axis, there is only one solder droplet 14 that needs to be deposited along the transverse fan axis. In addition, the angle φ is selected so that the distance that table 46 moves between any two droplets being deposited on substrate 22 is maximized, thereby permitting table 22 to be moved at the highest possible speed while still depositing all droplets 14 that need to be deposited. Soldering system 10 is capable of depositing solder droplets at a higher accuracy than generally required by user manufacturing specifications, and the excess allowable error in solder droplet location is used to slightly redefine the user-specified locations for droplets 14, in order to adjust the positions of droplets 14 so as to space them along the X axis and thereby permit increased table velocity, as is discussed below.

Figure 4:
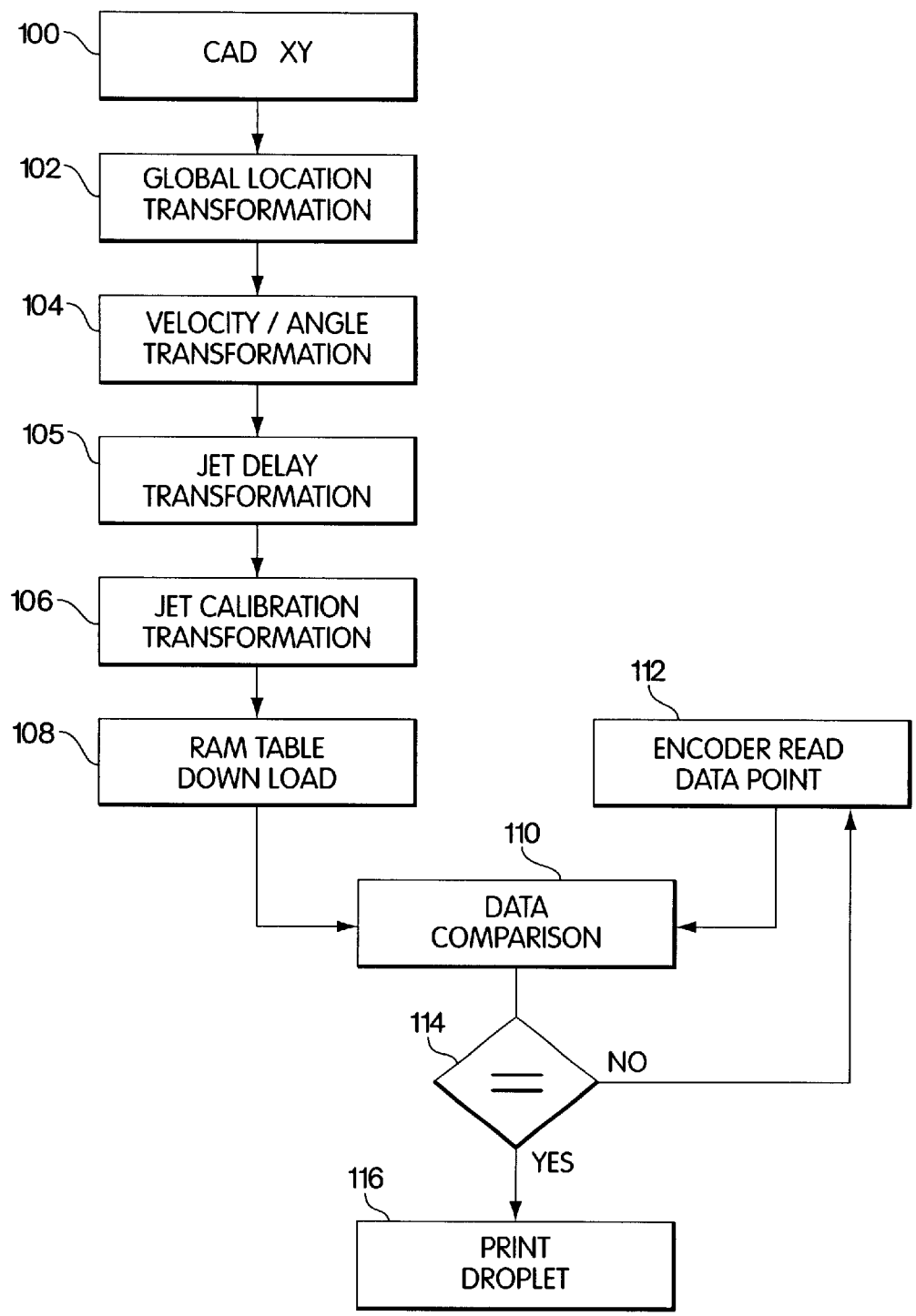
FIG. 4 is a flow chart showing a method of determining an optimum offset angle and depositing solder droplets at the offset angle.

FIG. 4 is a flow diagram that shows the steps involved in processing the raw computer aided design (CAD) data for user-specified solder pad locations on substrate 22. The CAD droplet position data are used to select the desired deflection plate offset angle and maximum table velocity, and to control the actual deposition of solder droplets by apparatus 10. In step 100, the CAD droplet position data are accessed. In step 102, the CAD droplet position data are subjected to a global transformation for a given substrate 22 that has been loaded and clamped on table 52. This involves moving table 52 along the X and Y axes, and viewing indicia at known positions on substrate 22 with camera 50 in order to determine the relative positions of substrate 22 and x-y table 46. The relative position data are used to transform the droplet positions specified by the raw CAD data into positions on the X-Y coordinate axes for x-y table 46.

Figure 5:
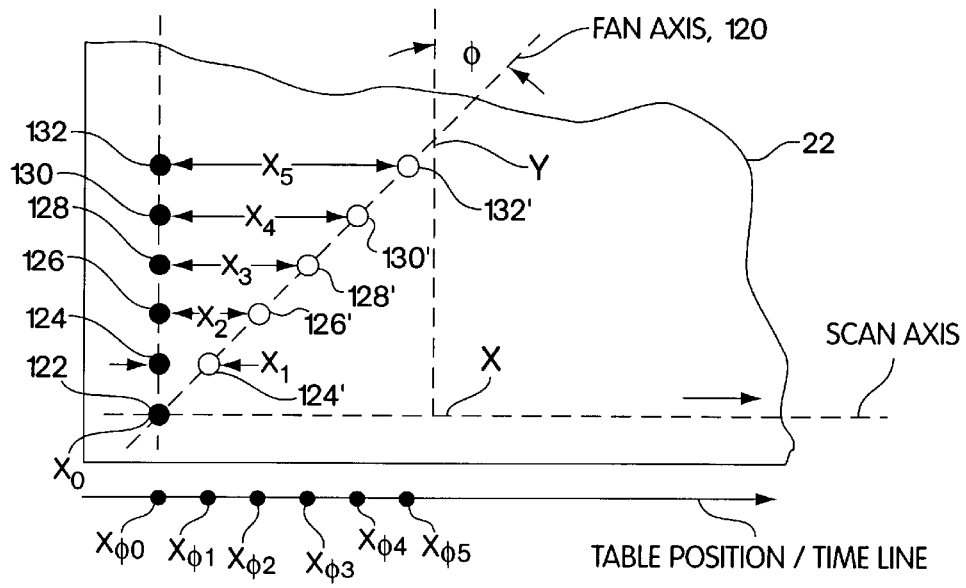
FIG. 5 is an illustration showing how to transform solder droplet coordinate pattern data to account for a fan axis oriented at an offset angle.

Step 104 involves processing the transformed CAD data from step 102 in order to identify the optimum angle and velocity. Appendix A hereto is a software listing for the process, and FIG. 5 illustrates the transformation of the (X, Y) coordinate position data to ($X_\phi$, Y) data that have been skewed to accommodate printing with deflection plates 16, 18 rotated from the Y axis by an angle $\phi$. Thus, FIG. 5 shows fan axis 120 at angle $\phi$ from the Y axis, and shows the X axis with a location $X_0$ at the intersection with the fan axis. (On FIG. 5, the X and Y axes are shown shifted from the positions shown in FIGS. 1–3 for purposes of illustration.) Table movement on FIG. 5 is to the right; thus in effect the X, Y coordinate axes move to the right. When table 22 is at the position shown, ejected solder droplet 122 (with a Y value of 0) will be deposited at coordinates $X_0$, 0. Solder droplets 124, 126, 128, 130, 132, also have X values of $X_0$, but Y values of $Y_1, Y_2, Y_3, Y_4$, and $Y_5$; they thus will not be printed until table 22 has moved to the right by the amounts $X_1, X_2, X_3, X_4$, and $X_5$, so that the locations are intersected by the skewed fan axis 120, as indicated by the circles 124', 126', 128', 130', and 132'. Because table 22 is moving at a constant velocity, the $X_1$–$X_5$ values are directly related to time. The time line below substrate 22 on FIG. 5 shows the time delays as transformed $X_\phi$ values. Thus, droplet 122 is still deposited at time zero with the fan axis at $X_0$; droplet 124 is now deposited at a time corresponding to the table moved distance $X_1$ from $X_0$; droplet 126 is now deposited at a time corresponding to distance $X_2$, droplet 128 is now deposited at a time corresponding to distance $X_3$, and so on. The transformed $X_\phi$ value thus equals the original X value plus the distance $X_i$ that: the table travels for the location to be under the fan axis, which is Y*tangent($\phi$). Thus, $$X_\phi = X_{(orig.)} + Y*tangent.$$

where: $X_{(orig.)}$ is the original X value, and $\phi$ is the angle that the fan axis has been rotated from the Y axis.

It will be appreciated that, depending on the angle $\phi$ and the pattern of desired locations of droplets 114 on substrate 22, droplets with higher $X_{(orig.)}$ values (e.g., there could be multiple vertical rows of droplets 114) can in many cases be deposited before droplets with smaller $X_{(orig.)}$ values. The optimum angle is determined by varying $\phi$ for all values between 0° and 45° in increments of 0.005*pi. (Other increment values, e.g., smaller than 0.005*pi, could be used.) For each value of $\phi$, the following steps are carried out.

Step A.

$X_\phi$ values are calculated for all solder droplet positions in the pattern and are sorted to arrange them in order of increasing $X_\phi$ value. This shows spacing along the X axis between droplets. In general, if two droplets have the same $X_\phi$, this angle $\phi$ cannot be used. The smallest distance between any two adjacent droplets on the time line will be the limiting factor on use of a high velocity, as the velocity cannot go above this distance divided by the time between consecutive ejected droplets, namely 0.000083 seconds (assuming a 12,000 Hz frequency).

Step B.

The $X_\phi$ values are adjusted to space them out along the X axis to use up excess error, namely user specified permitted error minus the error budget of system 10. E.g., if the user requires placement to within 0.0005" and apparatus 10 can place the droplets to within 0.0001", there is excess allowable error of up to 0.0004" that can be used to adjust each $X_\phi$ value to the left or the right so that the smallest spacing between any two $X_\phi$ values is increased as much as possible. This is done by an iterative procedure that involves making adjustments to three $X_{100}$ values at a time, moving the middle value to the midpoint between the other two to the extent permitted by allowable error, and moving over one value to make adjustments to a new group of three values. This is carried out back and forth across the time line until the smallest spacing between two adjacent values has been increased as much as possible to the extent permitted by allowable error.

Step C.

The distance d between the closest two $X_\phi$ values is calculated. This is the limiting factor on velocity.

Step D.

The maximum table velocity, V, is calculated by dividing d by the time between each droplet, which, for f=12,000 Hz is 0.000083 seconds. Thus, $$V = d/(0.00008).$$

Step E.

Compare V for this $\phi$ with the prior highest stored V calculated for prior values of $\phi$, and store the $\phi$ and V for the maximum V.

The angle $\phi$ is incremented by 0.005*pi, and steps A–E are repeated, and this is continued until all angles between 0° and 45° have been evaluated. The stored $\phi$ (from steps E) at the end of the evaluation of all angles is the one having the highest velocity, and it is used. Steps A–B are then repeated for this angle $\phi$ to regenerate the $X_\phi$ values to be used, and this completes the velocity/angle transformation step 104 of FIG. 4. The Y values remain unchanged (though the actual amount of deflection along the fan axis and charge used to achieve the deflection are functions of the angle $\phi$), and deflection plates 16, 18 are rotated to cause the fan axis to be at the angle $\phi$ from the Y axis.

In step 105 (FIG. 4), the $X_\phi$ values are adjusted to account for the fact that table 46 moves by a certain amount in the time it takes a charged droplet 14 that has broken away from stream 30 ejected from the orifice to reach substrate 22.

In step 106, the controls for deflecting droplets by charging individual particles and subjecting them to the field between plates 16, 18 are calibrated. This is done by depositing a pattern of droplets 14 at varying charge values and examining where the droplets 14 land with camera 50. The droplets may be deposited at other than intended locations along the fan axis, and in also might not lie precisely on the fan axis. The $X_\phi$ and Y values are adjusted accordingly. Step 106 can be, and preferably is, carried out before any other steps. Cameras 52, 54 can be used to verify actual position of droplets shortly before or during a run and to indicate whether there is a need to recalibrate.

In step 108, the position data used for print control, namely the angle-adjusted coordinate values ($X_{100}$, Y) from step 106, are loaded into a RAM table ready for use in print control.

During the deposition process, as table 46 moves along the X axis, position indicator 48 outputs a stream of data indicating the position along the X axis aligned with the fan axis. (Step 112). These values are compared with the $X_\phi$ values in the RAM table (step 114); when there is a match, the associated Y value is used to determine the charge applied to the droplet 14 being formed.

Droplets 14 are ejected at specific times that are integer multiples of the period between vibrations; these specific times are associated with locations along the X axis that are integer multiples of the minimum spacing value. The $X_\phi$ values might not coincide exactly the discrete locations for droplets, but differences in value are accounted for in the system error used in determining allowable error. The charges are applied at the precise times that the drops are breaking away.

At the times when there is no match of position indicator data with stored $X_\phi$ values, the droplets pass undeflected into gutter 20.

Other embodiments of the invention are within the scope of the claims. E.g., in place of the technique described in FIGS. 4 and 5 to determine an operating angle for the fan axis, other techniques can be used to determine an operating angle. In addition to maximization of table velocity, other factors, such as reduction in overall print time for the task at hand, could be considered in selecting an optimum operating angle for the fan axis. Also, whatever technique is used can be modified to account for specific sources of errors of significant magnitude. In particular, droplets with high charge, e.g., ones deflected to large distances along the fan axis, can have significant repulsive forces on droplets ejected immediately before or after them. If not avoided, the resulting error in placement of a drop can be significant. One technique to reduce such error is to keep droplet charges below a maximum specified level by limiting the distance deflected along the fan axis; where this limits the width of the path covered along the scan axis to less than the width of a substrate, multiple scans can be carried out, with the x-y table shifted by an appropriate amount along the Y axis between scans. Another technique is to impose a condition, at the time, e.g., of adjusting for allowable error on the time line in FIG. 5 (step B within step 104 of FIG. 4), to require minimum spacing between any two adjacent droplets (or any two droplets that otherwise would be at some close spacing) as a function of the charges of the two droplets so that the repulsive forces are kept to below a required level.

In addition, the ejector could be moved while the substrate is stationary to provide a relative movement along a scan axis. Also, the scanning movement could be rotatable instead of linear. Thus, the fan axis could be rotated (continuously or in steps) by rotating plates 16, 18 (with the ejector fixed or rotatable) while droplets are deflected along the fan axis to deposit a pattern of droplets. Alternatively, the substrate could be rotated (continuously or in steps) on a rotatable work table. In both cases there is relative movement between the fan axis and the substrate in order to place droplets at any desired location.

```
/*
================================================================================
= Filename: DCA.C                                      Creation Date: 06/12/95 =
= Author: Robert J. Balog                                                      =
================================================================================
=                                                                              =
=                              MPM Corp.                                       =
=                             10 Forge Park                                    =
=                           Franklin, MA 02038                                 =
=                             (508) 520-6999                                   =
=                                                                              =
=                           Copyright (c) 1995.                                =
=                                                                              =
================================================================================
DESCRIPTION: This file and program demonstrates the "FAN-ON-THE-FLY" algorithm
             developed by Robert J. Balog of MPM Corporation.  It consists of
             two parts; The Ball Position Error Displacement Distribution
             Optimizer and The Grid Array Skewing Algorithm.
-----------------------------------------------------------------------------*/

/*******************************************I************************************
 *                                                                              *
 *                            INCLUDE                                           *
 *                                                                              *
 ********************************************************************************/ include <stdio.h>        /* For "printf()"                              */
include <string.h>       /* For all string manipulation calls           */
#include <stdlib.h>
#include <conio.h>
#include <graph.h>
#include <math.h>
include <conio.h> define MPM_MASTER
include "mpm.h"

/*******************************************I************************************
 *                                                                              *
 *                        CONTANTS   DEFINITIONS                                *
 *                                                                              *
 ********************************************************************************/ define VERT 0
define HORZ 1 define SQUARE 0
define GRID   8 define PI 3.141592
define MAX_BINS 32000 typedef enum Tag_color_type
{
    FIRST_COLOR = 0,
    BLACK=0,
    BLUE=1,
    GREEN=2,
    CYAN=3,
    RED=4,
    LT_GRAY=7,
    DARK_GRAY=8,
    YELLOW=14,
    WHITE=15,
    COLOR_IN_USE
} color_type;
```

```
/*********************************************[**********************************
*                                                                                *
*                        GLOBAL   DEFINITIONS                                    *
*                                                                                *
**********************************************************************************/
typedef struct TAGXG
{
    int type;
    double x,y;                  /* X Y Position                    */
    double spacing[2];
    double off[2];
    int num[2];
    double lenx[2],leny[2];
    double dot_spacing;
    double ball_size;
} jdevice_type;

typedef struct TAGXX
{
    double x,y;                  /* X Y Position                    */
    double err;
} dot_type;

typedef struct
{
    dot_type pts[32000];
}SPTS;

typedef struct
{
    int bins[MAX_BINS];
}SBINS;

SPTS Spts;
SPTS orig_Spts;

SBINS Sbins0;
SBINS Sbins;

struct xycoord pos;

double avg[MAX_BINS];
double ball_rate = 12000.0;
double def_rate  = 6000.0;      /* 1/2 max ball rate */
double sx0 = -.4;               // Define lower left corner offset
double sy0 = -1.5;              // of the display window.
double sx1,sy1;
double size = 3.0;
double ball_dia = .0079;
double pixel;
double error ;

int num_pts = 0, closest = 0;
int max_bin;
```

```
/*****************************************************************
 *                                                                *
 *                    FUNCTION PROTOTYPES                         *
 *                                                                *
 *****************************************************************/
double find_closest_two(void);
int compare(dot_type *p1, dot_type *p2);
```

```
/*
=====================================================================
* Name:    main                                Creation Date: --/--/-- *
= Author:                                                              =
=====================================================================
DESCRIPTION:   main() sets up the GUI and runs in an infinite loop,
               prompting the operator to select one of the three operations
               available.  These are:

1. Ball Position Error Displacement Distribution Optimizer.

2. Grid Array Skewing Algorithm.

Q. Quit.

ARGUMENTS:         NONE
GLOBAL VARIABLES:
RETURN VALUES:
---------------------------------------------------------------------*/
main()
{
    double a;
    double time;
    double a_inc = 0.005;
    double dist,speed;
    double max_speed,best_angle;
    double xpos,ypos;
    char ch;
    int working;
    int loop=0;
    int l;

sx1 = (sx0 + size) * 640.0 / 480.0;  // Define upper right corner offset
    sy1 = sy0 + size;                    // of display window.
    pixel = size / 480.0;

_setvideomode(_VRES16COLOR);
    _setwindow(TRUE,sx0,sy0,sx1,sy1);    // Create the window.

for (;;)                             // Start the Infinite Loop
    {
        num_pts = 0;
        _clearscreen(_GCLEARSCREEN);     // Prompt the operator for action
        _settextposition(1,1);
        printf(
        "Please select program:\n\n"

"    Ball Position Error Displacement Distribution Optimizer ......... 1\n\n"

"    Grid Array Skewing Algorithm ................................... 2\n\n"

"    Quit ........................................................... Q\n\n"
            );
        ch = getch();
        if ((ch & 0xdf) == 'Q')          // If Quit ("Q" or "q")
            break;

/********************************[*********************************
         ***--------------------------------------------------------------***
         ***               Ball Position Error Displacement             ***
         ***                   Distribution Optimizer                    ***
         ***--------------------------------------------------------------***
         *****************************************************************/
        else if (ch == '1')
        {
            error = .2;

srand(clock());

for (l=0 ; l <40 ; l++)      // Create 40 (x,y) points with random
                                         // values for the x coordenate and
                                         // 0.0 for the y coordinate
                store_pt((double)rand() / (double)RAND_MAX * 3.5- .3,0.0);
```

```
    Spts = orig_Spts;          // Copy the array of points to "Spts"
    sort_pts();                // Sort the points from left to right // Find the distance between the
                               // closest pair of points
    dist = find_closest_two();
    draw_blank_screen();
    _settextposition(1,1);
    printf(                    // Display info and prompt operator again "****************************[****************************\n"
        "*------------------------------------------------------*\n"
        "***           Ball Position Error Displacement           ***\n"
        "***              Distribution Optimizer                  ***\n"
        "***------------------------------------------------------***\n"
        "******************************************************\n"

"Closest = %4.2f\n"
        "Press any key to continue with the\n"
        "Ball Position Error Displacement Distribution Optimizer\n",
        dist
        );

show_balls();

while (!kbhit());
    ch = getch();

ball_optimize();           // Spread appart all the balls on the X axis
                               // without exceeding the ball displacement
                               // error.
}
/**------------------------------------------------------***
 ***                     END OF                          ***
 ***                                                     ***
 ***           Ball Position Error Displacement          ***
 ***              Distribution Optimizer                 ***
 ***------------------------------------------------------**/

/******************************[******************************
 ***------------------------------------------------------***
 ***              Grid Array Skewing Algorithm.           ***
 ***------------------------------------------------------***
 ******************************************************/
else if (ch == '2')
{
    _clearscreen(_GCLEARSCREEN);
    _settextposition(1,1);
    printf(
        "/*****************************[*****************************\n"
        "***------------------------------------------------------***\n"
        "***              Grid Array Skewing Algorithm.           ***\n"
        "***------------------------------------------------------***\n"
        "*****************************************************/\n"
        );
    _settextposition(12,28);
    printf("Processing;  Please Wait\n");

error = .003;

/*****************************[*****************************
    ***              Create diferent SMT Array pads           ***
    *****************************************************/
    //single_sca(-0.1,0.05);

//for (l = 0 ; l < 2 ; l++)      // Create two grids
    //{
```

- 19 -

```
//      for (loop =0; loop < 10 ; loop++)      // Containing nine rowes
//          single_mot_bga(0.2 + (1 * 1.8),0.0);   // .65 ?? appart.
//} single_dca(-0.2,0.01);
//single_mot_bga(0.01,0.3);
single_mot_bga(0.1,0.0);
single_lsi(0.90,0.20);
single_qfp_12(1.2,0.05);
single_dca(1.75,0.01);
single_dca(1.75,.3);
single_mot_bga(2.1,0.0);
single_qfp_16(2.7,0.05);
//single_dca(3.15,0.01);
//single_dca(3.15,.3);
//single_mot_bga(3.5,0.0);
//single_qfp_16(4.1,0.05);

max_speed = -1.0;

/*********************************I*******************************************
***-------------------------------------------------------------------------***
***                    Grid Array Skewing Loop                             ***
***-------------------------------------------------------------------------***
******************************************************************************/
        for (a = 0.0 ; a < PI/4 ; a += a_inc)   // For a total of 45 degrees
        {                                       // angular rotation, rotate
            rotate_pts(a);                      // all the grids by "a_inc". Then,
            sort_pts();                         // sort all the points from left
            optimize();                         // to right, and spread them appart
                                                // on the X axis without exceeding
                                                // the ball displacement error.
            dist = find_closest_two();
            speed = dist * def_rate;            // Calculate the board speed and
                                                // hold the best angle for the speed.
            if (speed > max_speed)
            {
                max_speed = speed;
                best_angle = a;
            }

} draw_blank_screen();        // At the end of 45 degrees skewing process
        rotate_pts(best_angle);     // go back to the angle that produced the
                                    // best speed, and recalculate the best skew.
        sort_pts();                 // Sort left to right
        optimize();
        draw_device();              // Draw the Skewed pads Sbins = Sbins0;             // Zero-out the "bins"
        for (l = 0 ; l < num_pts ; l++)
        {
            Sbins.bins[(int)((Spts.pts[l].x - sx0) / pixel + .5)] += 1;
                                    // Count points of the
        }                           // same x coordinate
        display_bins();

dist = find_closest_two();
        _setcolor(RED);             // Mark the location of the closest two balls
                                    // with a red line
        _moveto_w(xpos=(double)closest * pixel + sx0,0.0);
        _lineto_w(xpos,0.5);

speed = dist * def_rate;
        time = (sx1 - sx0) / speed;
```

```
        _settextposition(1,1);
        printf(                  // Display info and prompt operator again "/****************************************I*****************************************\n"
            "*-------------------------------------------------------------------------------*\n"
            "***                    Grid Array Skewing Algorithm.                             ***\n"
            "***-------------------------------------------------------------------------------***\n"
            "*******************************************************************************/\n"
            "Closest = %f    Speed = %f    Angle = %4.1f\n"
            "Print Time = %4.1f    Balls = %d    Balls/Sec = %5.1f    Utilization = %4.1f%%\n"
            "Press any key to continue...\n",
            dist,speed,best_angle * 180.0 / PI,time,
            num_pts,num_pts/ time,(num_pts/time)/ ball_rate * 100.0
            );
    } while (!kbhit());
    getch();
    }

_setvideomode(_DEFAULTMODE);
}
```

```
/*
==============================================================================
= Name:                                             Creation Date: --/--/-- =
= Author:                                                                   =
==============================================================================
DESCRIPTION:
ARGUMENTS:
GLOBAL VARIABLES: .
RETURN VALUES:
-----------------------------------------------------------------------------*/
store_pt(double x, double y)
{
    orig_Spts.pts[num_pts].x = x;
    orig_Spts.pts[num_pts].y = y;
    num_pts++;
}

/*
==============================================================================
= Name:                                             Creation Date: --/--/-- =
= Author:                                                                   =
==============================================================================
DESCRIPTION:
ARGUMENTS:
GLOBAL VARIABLES:
RETURN VALUES:
-----------------------------------------------------------------------------*/
display_bins()
{
    int l;
    double xpos,ypos;

_setcolor(CYAN);
    _settextposition(1,1);

for (l = 0 ; l < MAX_BINS ; l++)
    {
        if (Sbins.bins[l] != 0)
        {
            xpos = (double)l * pixel + sx0;
            ypos = (double)Sbins.bins[l] * pixel* 3.0;
            _moveto_w(xpos,sy0);
            _lineto_w(xpos,sy0 + ypos);
        }
    }
}
```

```
/*
===========================================================================
= Name:   rotate_pts                            Creation Date: --/--/-- =
= Author:                                                                =
===========================================================================
DESCRIPTION:         This function slides -on the X axis- all the balls in
                     "orig_Spts.pts[]". The slide or displacement is equal to the
                     sine of the skewing "angle".

ARGUMENTS:           angle

GLOBAL VARIABLES:    num_pts, orig_Spts, Spts, Sbins

RETURN VALUES:       NONE
--------------------------------------------------------------------*/
rotate_pts(double angle)
{
    int l;
    double x,y,z;
    double d;

//  Sbins = Sbins0;                          // Zero-out the "bins"
    z = tan(angle);

for (l = 0 ; l < num_pts ; l++)
    {
        x = orig_Spts.pts[l].y * z;          // Rotate all columns of
        y = orig_Spts.pts[l].y;              // poinst (x,y) by angle
                                             // calculating the sine
        Spts.pts[l].x = orig_Spts.pts[l].x + x; // of angle and adding
        Spts.pts[l].y = y;                   // it to x.
        Spts.pts[l].err = 0.0;

//      Sbins.bins[(int)((Spts.pts[l].x - sx0) / pixel + .5)] += 1;
                                             // Count points of the
    }                                        // same x coordinate
}
```

```
/*
=================================================================
= Name: sort_pts                          Creation Date: --/--/-- =
= Author:                                                         =
=================================================================
DESCRIPTION:
ARGUMENTS:
GLOBAL VARIABLES:
RETURN VALUES:
-----------------------------------------------------------------*/
sort_pts()
{
    qsort(Spts.pts,num_pts,sizeof(dot_type),compare);
} int compare(dot_type *p1, dot_type *p2)
{
    if (p1->x < p2->x)
        return(-1);

if (p1->x == p2->x)
        return(0);

return(1);
}
```

```
/*
===============================================================================
= Name:   find_closest_two                            Creation Date: --/--/-- =
= Author:                                                                     =
===============================================================================
DESCRIPTION:     This function parses an array of (x,y) points, searching for
                 the pair of point closest to each other.  It returns the
                 distance between this pair of points.

ARGUMENTS:       NONE

GLOBAL VARIABLES: num_pts, Spts.pts[], closest

RETURN VALUES:   min (the distance between the two closest points)
------------------------------------------------------------------------*/
double find_closest_two()
{
    int l;
    double d;
    double min = 99999.99;

for (l = 0 ; l < num_pts-1 ; l++)
    {
        d = fabs(Spts.pts[l+1].x - Spts.pts[l].x);

if (d < min)
        {
            min = d;
            closest = l;
        }
    } return(min);
}
```

```
/*
===============================================================================
= Name:                                              Creation Date: --/--/-- =
= Author:                                                                    =
===============================================================================
DESCRIPTION:
ARGUMENTS:
GLOBAL VARIABLES:
RETURN VALUES:
-----------------------------------------------------------------------------*/
draw_device()
{
    double xpos,ypos;
    double padx,pady;
    int l;

padx = pady = 0.003;

_setcolor(YELLOW);

for (l = 0 ; l < num_pts ; l++)
    {
        xpos = Spts.pts[l].x;
        ypos = Spts.pts[l].y;
        _setpixel_w(xpos,ypos);
        if ((Spts.pts[l].err <= -error) || (Spts.pts[l].err >= error))
        {
            _setcolor(CYAN);
            _setpixel_w(xpos,ypos);
            _setcolor(YELLOW);
        }

}
}
```

```
/*
==============================================================================
= Name:                                           Creation Date: --/--/-- =
= Author:                                                                 =
==============================================================================
DESCRIPTION:
ARGUMENTS:
GLOBAL VARIABLES:
RETURN VALUES:
----------------------------------------------------------------------------*/
draw_blank_screen()
{
    _clearscreen(_GCLEARSCREEN);
    _setcolor(LT_GRAY);
    _setlinestyle(0x1111);
    _moveto_w(sx0,sy0 + size/2.0);
    _lineto_w(sx1,sy0 + size/2.0);
    _moveto_w(sx0,sy0);
    _lineto_w(sx1,sy0);
    _setlinestyle(0xFFFF);

}
```

```
/*
===============================================================================
= Name:                                          Creation Date: --/--/-- =
= Author:                                                                =
===============================================================================
DESCRIPTION:
ARGUMENTS:
GLOBAL VARIABLES:
RETURN VALUES:
-----------------------------------------------------------------------*/
void single_dca(double xp, double yp)
{
    int x,y;
    double rowsp;

rowsp = .0197;

for ( y = 0 ; y <=10 ; y++)
    {
        store_pt(xp +0.0,yp + (double)y * rowsp);
        store_pt(xp +0.0 - 0.5 * rowsp,yp + (double)y * rowsp + .5 * rowsp);
    } for ( x = 0 ; x < 10 ; x++)
    {
        store_pt(xp + (double)x * rowsp,yp + 11.0  * rowsp);
        store_pt(xp + (double)x * rowsp + .5 * rowsp,yp+ 11.0  * rowsp - .5 * rowsp);
    } for ( y = 11 ; y >= 1 ; y--)
    {
        store_pt(xp+ 10.0 * rowsp,yp + (double)y * rowsp);
        store_pt(xp+ 10.0* rowsp  + 0.5 * rowsp,yp+ (double)y * rowsp - .5 * rowsp);
    } for ( x = 10 ; x >=1 ; x--)
    {
        if ((x >=3 ) && ( x <=6))
            store_pt(xp+ (double)x * rowsp,yp+ rowsp);
        else
            store_pt(xp + (double)x * rowsp,yp+ 0.0);

if ((x >=3 ) && ( x <=7))
            store_pt(xp+ (double)x * rowsp - .5 * rowsp,yp + rowsp + .5 * rowsp);
        else
            store_pt(xp + (double)x * rowsp - .5 * rowsp,yp+ 0.0 + 0.5 * rowsp);

;
    }
}
```

```
/*
==============================================================================
= Name:                                          Creation Date: --/--/-- =
= Author:                                                                =
==============================================================================
DESCRIPTION:
ARGUMENTS:
GLOBAL VARIABLES:
RETURN VALUES:
------------------------------------------------------------------------*/
void single_mot_bga(double x, double y)
{
    jdevice_type g;

g.type = GRID;                              // Setup grid attributes
    g.spacing[VERT] = 0.060;
    g.spacing[HORZ] = 0.060;
    g.off[VERT] = 0.08;
    g.off[HORZ] = 0.08;
    g.num[VERT] = 8;
    g.num[HORZ] = 9;
    g.lenx[VERT] = 0.0020;
    g.leny[VERT] = 0.060;
    g.lenx[HORZ] = 0.060;
    g.leny[HORZ] = 0.0020;
    g.dot_spacing = .0021;
    g.ball_size = ball_dia;

g.y = y;
    g.x = x;

draw_mot_grid(&g);
}
```

```
/*
===============================================================================
= Name:                                           Creation Date: --/--/-- =
= Author:                                                                 =
===============================================================================
DESCRIPTION:
ARGUMENTS:
GLOBAL VARIABLES:
RETURN VALUES:
-----------------------------------------------------------------------------*/
void draw_mot_grid(jdevice_type *d)
{
    int x,y;
    double xpos,ypos;
    double ydef;

for (x = 0 ; x < d->num[VERT] ; x++)
    {
        xpos = d->x + x * d->spacing[VERT];
        ypos = d->y + 0.0 * d->spacing[HORZ];          // FIC:This evaluates to d->y for (y= 0 ; y < d->num[HORZ] ; y++)
        {
            if (((x==0) && (y==0)) ||                  // If at the
                ((x==0) && (y== d->num[HORZ] -1)))     // horizontal end
            {                                          // Do nothing
            }
            else if (((x==d->num[VERT] -1) && (y==0)) ||
                     ((x==d->num[VERT] -1) && (y== d->num[HORZ] -1))) // If at the
            {                                          // vertical end
            }                                          // Do nothing else
            {
                ydef = y * d->spacing[HORZ];

store_pt(xpos,ypos+ ydef);             // A new "Y"
            }
        }
    }
}
```

```
/*
==============================================================================
= Name:                                          Creation Date: --/--/-- =
= Author:                                                                 =
==============================================================================
DESCRIPTION:
ARGUMENTS:
GLOBAL VARIABLES:
RETURN VALUES:
-----------------------------------------------------------------------*/
single_lsi(double xp, double yp)
{
    int x,y;
    double rowsp,hshift;
    double dia;

dia = .004;                           // Size of Balls wanted
    rowsp = .00984;
    hshift = 0.00846;

for ( y = 0 ; y <= 36 ; y++)
    {
        store_pt(-.1991 + xp         , 0.1796 + yp - (double)y * rowsp);
        store_pt(-.1991 + xp + hshift, 0.1796 + yp - (double)y * rowsp - rowsp / 2.0) ;
    } for ( x = 0 ; x <= 36 ; x++)
    {
        store_pt(-.17961 + xp + (double)x * rowsp, -.1991 + yp);
        store_pt(-.17961 + xp + (double)x * rowsp + rowsp/2.0, -.1991 + yp + hshift);
    } for ( y = 0 ; y <= 36 ; y++)
    {
        store_pt(.1991 + xp         , -0.1796 + yp + (double)y * rowsp);
        store_pt(.1991 + xp - hshift, -0.1796 + yp + (double)y * rowsp + rowsp / 2.0) ;
    } for ( x = 0 ; x <= 36 ; x++)
    {
        store_pt(.17961 + xp + (double)-x * rowsp, .1991 + yp);
        store_pt(.17961 + xp + (double)-x * rowsp - rowsp/2.0, .1991 + yp - hshift);
    }

}
```

- 31 -

```
/*
==============================================================================
= Name:                                                 Creation Date: --/--/-- =
= Author:                                                                      =
==============================================================================
DESCRIPTION:
ARGUMENTS:
GLOBAL VARIABLES:
RETURN VALUES:
------------------------------------------------------------------------*/
single_qfp_12(double x, double y)
{
    jdevice_type q;

q.type = SQUARE;
    q.x = x;
    q.y = y;
    q.spacing[VERT] = 0.012;
    q.spacing[HORZ] = 0.012;
    q.off[VERT] = 0.06;
    q.off[HORZ] = 0.06;
    q.num[VERT] = 18;
    q.num[HORZ] = 18;
    q.lenx[VERT] = 0.0020;
    q.leny[VERT] = 0.054;
    q.lenx[HORZ] = 0.054;
    q.leny[HORZ] = 0.0020;
    q.dot_spacing = ball_dia;

show_device_sides(&q,VERT,2);
    show_device_sides(&q,HORZ,2);
}
```

```
/*
===============================================================================
= Name:                                              Creation Date: --/--/-- =
= Author:                                                                    =
===============================================================================
DESCRIPTION:
ARGUMENTS:
GLOBAL VARIABLES:
RETURN VALUES:
-----------------------------------------------------------------------------*/
single_qfp_16(double x, double y)
{
    jdevice_type q;

q.type = SQUARE;
    q.x = x;
    q.y = y;
    q.spacing[VERT] = 0.016;
    q.spacing[HORZ] = 0.016;
    q.off[VERT] = 0.06;
    q.off[HORZ] = 0.06;
    q.num[VERT] = 14;
    q.num[HORZ] = 14;
    q.lenx[VERT] = 0.0020;
    q.leny[VERT] = 0.054;
    q.lenx[HORZ] = 0.054;
    q.leny[HORZ] = 0.0020;
    q.dot_spacing = ball_dia;

show_device_sides(&q,VERT,2);
    show_device_sides(&q,HORZ,2);
}
```

```c
/*
===============================================================================
= Name:                                              Creation Date:  --/--/-- =
= Author:                                                                     =
===============================================================================
DESCRIPTION:
ARGUMENTS:
GLOBAL VARIABLES:
RETURN VALUES:
------------------------------------------------------------------------------*/
void show_device_sides(jdevice_type *d, int which, int number)
{
    int p;
    double x,y;

if (which == HORZ)
    {
        /******************************/
        /* Draw Y pads first    HORZ  */
        /******************************/ x = d->x;
        for (p = 0 ;p < d->num[HORZ] ; p++)
        {
            y = d->y + d->off[HORZ] + (double)p * d->spacing[HORZ];
            draw_pad(x,y,d->lenx[HORZ],d->leny[HORZ],d->dot_spacing);
        }
        if (number == 2)
        {
            x = d->x + 2.0 * d->off[VERT] + ((double)d->num[VERT]-1.0) * d->spacing[VERT];
            for (p = 0 ;p < d->num[HORZ] ; p++)
            {
                y = d->y + d->off[HORZ] + (double)p * d->spacing[HORZ];
                draw_pad(x,y,d->lenx[HORZ],d->leny[HORZ],d->dot_spacing);
            }
        }
    }
    else
    {
        /******************************/
        /* Draw X pads first    VERT  */
        /******************************/ y = d->y;
        for (p = 0 ;p < d->num[VERT] ; p++)
        {
            x = d->x + d->off[VERT] + (double)p * d->spacing[VERT];
            draw_pad(x,y,d->lenx[VERT],d->leny[VERT],d->dot_spacing);
        }
        if (number == 2)
        {
            y = d->y + 2.0 * d->off[HORZ] + ((double)d->num[HORZ]-1.0) * d->spacing[HORZ];
            for (p = 0 ;p < d->num[VERT] ; p++)
            {
                x = d->x + d->off[VERT] + (double)p * d->spacing[VERT];
                draw_pad(x,y,d->lenx[VERT],d->leny[VERT],d->dot_spacing);
            }
        }
    }
}
```

- 34 -

```c
/*
==============================================================================
= Name:                                          Creation Date: --/--/-- =
= Author:                                                                =
==============================================================================
DESCRIPTION:
ARGUMENTS:
GLOBAL VARIABLES:
RETURN VALUES:
------------------------------------------------------------------------------*/
void draw_pad(double x, double y, double lenx, double leny,double spacing)
{
    double num_x_balls;
    double num_y_balls;
    double xstart,ystart;
    double xend,yend;
    int xi,yi;
    double xpos,ypos;
    double xinc,yinc;

num_x_balls = (double)((int)((lenx- ball_dia) / spacing)) +1.0;
    num_y_balls = (double)((int)((leny- ball_dia) / spacing)) +1.0;

if (num_x_balls < 1 ) num_x_balls = 1;
    if (num_y_balls < 1 ) num_y_balls = 1;

//      printf("X Balls = %f %f\n",num_x_balls,num_y_balls);

xstart = x +  -1.0 * (num_x_balls / 2.0 * spacing)  + spacing / 2.0;
    xend   = x +   1.0 * (num_x_balls / 2.0 * spacing)  - spacing / 2.0;

ystart = y +  -1.0 * (num_y_balls / 2.0 * spacing)  + spacing / 2.0;
    yend   = y +   1.0 * (num_y_balls / 2.0 * spacing)  - spacing / 2.0;

if (num_x_balls > num_y_balls)
    {
        ypos = ystart;
        xinc = spacing;
        for (yi = 0 ; yi < num_y_balls ; yi++)
        {
            xinc = spacing;
            xpos = xstart;

for (xi = 0 ; xi < num_x_balls ; xi++)
            {
                store_pt(xpos,ypos);
                //                    printf("%f %f \n",xpos,ypos);
                xpos += xinc;
            } ypos += spacing;
        }
    }
    else
    {
        xpos = xstart;
        yinc = spacing;
        for (xi = 0 ; xi < num_x_balls ; xi++)
        {
            yinc = spacing;
            ypos = ystart;

for (yi = 0 ; yi < num_y_balls ; yi++)
            {
                store_pt(xpos,ypos);
                //                    printf("%f %f \n",xpos,ypos);
                ypos += yinc;
            }
            xpos += spacing;
        }
    }
}
```

- 35 -

```
/*
==============================================================================
= Name: show_balls                                      Creation Date: --/--/-- =
= Author:                                                                      =
==============================================================================
DESCRIPTION:        This function draws the points (balls) in "Spts.pts[]"
                    in yellow.  Any ball that has moved up to the maximum error
                    associated with it, is shown with a RED interior.  The two
                    closest balls are shown with cyan border.

ARGUMENTS:          NONE

GLOBAL VARIABLES:   Spts.pts[], num_pts, error, closest

RETURN VALUES:      NONE
------------------------------------------------------------------------------*/
show_balls()
{
    double xpos,ypos;
    double padx,pady;
    int l;

padx = pady = 0.015;

_setcolor(YELLOW);

for (l = 0 ; l < num_pts ; l++)
    {
        xpos = Spts.pts[l].x;
        ypos = Spts.pts[l].y;
        _ellipse_w(_GFILLINTERIOR,xpos-padx,ypos-pady,xpos+padx,ypos+pady);
        if ((Spts.pts[l].err >= error) || (Spts.pts[l].err <= -error))
        {
            _setcolor(RED);
            _ellipse_w(_GFILLINTERIOR,xpos-padx,ypos-pady,xpos+padx,ypos+pady);
            _setcolor(YELLOW);
            _ellipse_w(_GBORDER,xpos-padx,ypos-pady,xpos+padx,ypos+pady);
        }
    }
    _setcolor(CYAN);
    xpos = Spts.pts[closest].x;
    ypos = Spts.pts[closest].y;
    _ellipse_w(_GBORDER,xpos-padx,ypos-pady,xpos+padx,ypos+pady);
    xpos = Spts.pts[closest+1].x;
    ypos = Spts.pts[closest+1].y;
    _ellipse_w(_GBORDER,xpos-padx,ypos-pady,xpos+padx,ypos+pady);
}
```

```
/*
==============================================================================
= Name:    move_pt                              Creation Date: --/--/-- =
= Author:                                                                =
==============================================================================
DESCRIPTION:        This function moves the point Spts.pts[l] on the X axix
                    by the amount passed in the argument "error".  In addition,
                    it updates the total error that point has moved so far.

ARGUMENTS:          l, error

GLOBAL VARIABLES:   Spts.pts[]

RETURN VALUES:      NONE
-----------------------------------------------------------------------*/
move_pt(int l , double error)
{
    Spts.pts[l].x += error;
    Spts.pts[l].err += error;
}
```

```
/*
================================================================================
= Name:    balance                                  Creation Date: --/--/-- =
= Author:                                                                   =
================================================================================
DESCRIPTION:    This function performs a RUNNING TRIO sweep of all the points
                (balls) in array "Spts.pts[]". It centers them between
                neighboring points.

Spts.pts[l-1]    Spts.pts[l]       Spts.pts[l+1]

--------O---------------O-------------------O--------
                        \...f_left.../ \.....f_right...../ f_right    O-------------------O  \
                  - f_left     O--------------O        |
                  ---------  = ---------------------   |
                    force                      |----|  \  This operation finds the
                                                       /  off-center error to shift
                    fix      = force / 2  =    |--|    |  "Spts.pts[l]" by.
                                                       |
                                                       /

"fix" is the off-center error that the middle point Spts.pts[l]
                needs to be moved by to be centered between Spts.pts[l-1] and
                Spts.pts[l+1]

ARGUMENTS:         NONE

GLOBAL VARIABLES:  num_pts, Spts.pts[], error

RETURN VALUES:     changed
-----------------------------------------------------------------------------*/
balance()
{
    int l;
    double force;
    double f_left,f_right;
    double fix;
    int changed;

changed = FALSE;
    for (l = 1 ; l < num_pts-1 ; l++)           // For every point between the
    {                                           // first and the last; find
        f_left  = Spts.pts[l].x - Spts.pts[l-1].x;    // the off-center error of
        f_right = Spts.pts[l+1].x - Spts.pts[l].x;    // the middle point of a
        force = f_right - f_left;                     // RUNNING TRIO of points.

fix = force / 2;

if (Spts.pts[l].err + fix > error)      // If the estimated ball
        {                                       // displacement error exceeds
            fix = error - Spts.pts[l].err;      // the maximum allowed
        }                                       // error, truncate it to the
        else if (Spts.pts[l].err + fix < -error) // value of error on
        {                                       // either direction.
            fix = -error - Spts.pts[l].err;
        }
                                                // However, move the ball only
        if ((fix >= 0.00001) || (fix <= -0.00001))
        {                                       // if the off-center is significant.
            changed = TRUE;                     // Check this if anything moved.
            move_pt(l,fix);
        }
    }
    return(changed);
}
```

- 38 -

```
/*
==============================================================================
= Name:                                            Creation Date: --/--/-- =
= Author:                                                                   =
==============================================================================
DESCRIPTION:    This function parses through the array of points "Spts.pts[]";
                distributing and optimizing the maximum allowed error
                displacement among all the points (balls) in "Spts.pts[]".
                This is a recursive series approximation that truncates
                with a minimum displacement distribution of 0.00001" as
                determined by the function "balance()".

ARGUMENTS:
GLOBAL VARIABLES:
RETURN VALUES:
------------------------------------------------------------------------------*/
optimize()
{
    int working;
    int l;
    int count=0;

move_pt(0,-error);              // Start with the points at each end
    move_pt(num_pts-1,error);       // Move them appart as much as the
                                    // maximum error.

working = TRUE;
    while (working)                 // Then spread-out all the balls in
    {                               // between, as long as there is room to
        working = balance();        // move.  During this process, count
        count++;                    // number of recursions.
    }

}
```

```
/*
========================================================================
= Name:  ball_optimize                         Creation Date: --/--/-- =
= Author:                                                              =
========================================================================
DESCRIPTION:    This function parses through the array of points "Spts.pts[]";
                distributing and optimizing the maximum allowed error
                displacement among all the points (balls) in "Spts.pts[]".
                This is a recursive series approximation that truncates
                with a minimum displacement distribution of 0.00001" as
                determined by the function "balance()".

In addition, this function continuously redraws the balls
                reflecting their new position as they are shifted on the X
                axis.  This refreshing also marks the balls that have reached
                their maximum error displacement with a RED RIM.

ARGUMENTS:      NONE
GLOBAL VARIABLES: error,
RETURN VALUES:
-------------------------------------------------------------------------*/
ball_optimize()
{
    int working;
    int l;
    double dist;
    char ch;
    int count=0;

move_pt(0,-error);              // Start with the points at each end
    move_pt(num_pts-1,error);       // Move them apart as much as the
                                    // maximum error.
    working = TRUE;
    while (working)                 // Then spread-out all the balls in
    {                               // between, as long as there is room to
        draw_blank_screen();        // move.  During this process, keep
        show_balls();               // drawing the balls in their new
                                    // positions, and count the
                                    // number of recursions.
        working = balance();
        find_closest_two();
        count++;
    } dist = find_closest_two();      // Then find the distance between the two
    _settextposition(1,1);          // closest balls, and display it as well
    printf("Closest = %4.2f\n",dist); // the iterations.
    printf("Loops = %d      \n",count);
}
```

What is claimed is:

1. An apparatus for depositing a selected pattern of solder droplets onto a substrate on which one or more components are to be mounted, the apparatus comprising a substrate support having structure for supporting a substrate on which one or more components are to be mounted via pads deposited on said substrate, an ejector positioned relative to the substrate to eject droplets for deposit onto the substrate, said substrate and said ejector being relatively movable with respect to each other along a scan axis, an electrically conductive element, positioned adjacent to the droplets, for selectively applying charges to the droplets, and field generating elements, positioned downstream of the conductive element, for defining an electrical field therebetween for selectively deflecting the charged droplets along a fan axis that is transverse to said scan axis;

wherein said substrate has a substrate axis on which droplets are to be deposited, and wherein said substrate is oriented with respect to said fan axis so that said substrate axis makes an acute angle with said fan axis to permit droplets to be deflected along said fan axis and deposited on said substrate axis while said substrate and said ejector continuously move with respect to other along said scan axis.

2. The apparatus of claim 1, wherein said substrate is movable along a scan axis with continuous movement.

3. The apparatus of claim 1 wherein said ejector is movable along a scan axis with continuous movement.

4. The apparatus of claim 1 wherein said deflection elements are rotatable about an axis which is normal to the substrate in order to orient said substrate with respect to said fan axis.

5. The apparatus of claim 1 wherein said structure for bearing a substrate is adjustable to adjust the angle between said substrate axis and said fan axis.

6. The apparatus of claim 1 wherein said ejector ejects said droplets as a stream of droplets.

7. An apparatus for depositing a selected pattern of solder droplets onto a substrate, the apparatus comprising a substrate support having structure for supporting a substrate in the apparatus, an ejector positioned above the substrate support to eject droplets for deposit onto the substrate, said substrate and said ejector being relatively movable with respect to each other along a scan axis, an electrically conductive element disposed below the ejector, for selectively applying charges to the droplets, and field generating elements, positioned downstream of the conductive element that define an electrical field therebetween to selectively deflect the charged droplets along a fan axis, wherein the fan axis forms an acute angle with the scan axis.

8. The apparatus of claim 7, wherein the field generating elements are rotatable about an axis that is normal to the substrate to vary the acute angle between the scan axis and the fan axis.

9. The apparatus of claim 7, wherein the substrate support structure is adapted to provide movement of the substrate along the scan axis.

10. An apparatus for depositing a selected pattern of solder droplets onto a substrate having a substrate axis, the apparatus comprising a substrate support having structure that supports a substrate in the apparatus and moves the substrate in the apparatus along a scan axis that is normal to the substrate axis, an ejector positioned above the substrate support to eject droplets for deposit onto the substrate, an electrically conductive element disposed below the ejector, for selectively applying charges to the droplets, and means for deflecting the charged droplets to form a line of droplets on the substrate as the substrate is continuously moved in the apparatus, wherein the line of droplets is parallel to the substrate axis.

11. The apparatus of claim 10, wherein the means for deflecting includes field generating plates that deflect the charged droplets, and the apparatus further comprises means for adjusting the field generating plates based on a speed of movement of the substrate to maintain the line of droplets parallel to the substrate axis.

12. The apparatus of claim 11, wherein the field generating plates deflect the charged droplets along a fan axis that forms an acute angle with the substrate axis.

* * * * *